United States Patent
Liu et al.

(10) Patent No.: US 6,175,129 B1
(45) Date of Patent: *Jan. 16, 2001

(54) CAPACITOR STRUCTURES, DRAM CELL STRUCTURES, METHODS OF FORMING CAPACITORS, METHODS OF FORMING DRAM CELLS, AND INTEGRATED CIRCUITS INCORPORATING CAPACITOR STRUCTURES AND DRAM CELL STRUCTURES

(75) Inventors: Yauh-Ching Liu, Sunnyvale, CA (US); David Y. Kao, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/274,548

(22) Filed: Mar. 23, 1999

Related U.S. Application Data

(63) Continuation of application No. 08/798,241, filed on Feb. 11, 1997, now Pat. No. 5,905,280.

(51) Int. Cl.[7] .................................................. H01L 29/72
(52) U.S. Cl. ..................... 257/301; 257/303; 257/305; 257/307; 257/311; 257/298; 257/304; 257/306; 257/309; 257/312
(58) Field of Search ................................. 257/301, 298, 257/303, 304, 305, 306, 307, 309, 311, 312

(56) References Cited

U.S. PATENT DOCUMENTS 4,845,537   7/1989   Nishimura et al. .

(List continued on next page.)

OTHER PUBLICATIONS

Fully Self–Aligned 6F[2] Cell Technology for Low Cost 1Gb DRAM, M. Aoki, T. Ozaki, T. Yamada, H. Kawaguchiya, Y. Ishibashi & T. Hammamoto, 1996 Symposium on VLSI Technology Digest of Technical Papers, Jan. 1996 IEEE, pp. 22–23.

(List continued on next page.)

Primary Examiner—Edward Wojciechowicz
(74) Attorney, Agent, or Firm—Wells, St. John, Roberts, Gregory & Matkin

(57) ABSTRACT

Semiconductor capacitor constructions, DRAM cell constructions, methods of forming semiconductor capacitor constructions, methods of forming DRAM cell constructions, and integrated circuits incorporating capacitor structures and DRAM cell structures are encompassed by the invention. The invention includes a method comprising: a) forming an opening within an insulative layer and over a node location; b) forming a spacer within the opening to narrow the opening, the spacer having inner and outer surfaces, the inner surface forming a periphery of the narrowed opening; c) removing a portion of the insulative layer from proximate the outer surface to expose at least a portion of the outer surface; d) forming a storage node layer in electrical connection with the node location, extending along the spacer inner surface, and extending along the qexposed spacer outer surface; and e) forming a dielectric layer and a cell plate layer operatively proximate the storage node layer. The invention also includes a construction comprising: a) an opening extending through an insulative layer to a node location; b) a conductive spacer within the opening and narrowing at least a portion of the opening; the conductive spacer having inner and outer surfaces; c) a storage node layer in connecting with the node location and extending along both of the inner and outer surfaces of the conductive spacer, the storage node layer and conductive spacer together forming a capacitor storage node; and d) a dielectric layer and a cell plate layer operatively proximate the storage node.

12 Claims, 10 Drawing Sheets

U.S. PATENT DOCUMENTS

| | | |
|---|---|---|
| 4,864,374 | 9/1989 | Banerjee . |
| 5,170,233 | 12/1992 | Liu et al. . |
| 5,206,183 | 4/1993 | Dennison . |
| 5,227,325 | 7/1993 | Gonzalez . |
| 5,229,310 | 7/1993 | Sivan . |
| 5,229,326 | 7/1993 | Dennison et al. . |
| 5,244,826 | 9/1993 | Gonzalez et al. . |
| 5,270,968 | 12/1993 | Kim et al. . |
| 5,283,455 | 2/1994 | Inoue et al. . |
| 5,318,927 | 6/1994 | Sandhu et al. . |
| 5,323,038 | 6/1994 | Gonzalez et al. . |
| 5,334,862 | 8/1994 | Manning et al. . |
| 5,338,700 | 8/1994 | Dennison et al. . |
| 5,385,858 | 1/1995 | Manabe . |
| 5,391,511 | 2/1995 | Doan et al. . |
| 5,401,681 | 3/1995 | Dennison . |
| 5,438,011 | 8/1995 | Blalock et al. . |
| 5,444,013 | 8/1995 | Akram et al. . |
| 5,498,562 | 3/1996 | Dennison et al. . |
| 5,563,089 | 10/1996 | Jost et al. . |
| 5,604,147 | 2/1997 | Fischer et al. . |
| 5,605,857 | 2/1997 | Jost et al. . |
| 5,608,247 | 3/1997 | Brown . |
| 5,612,558 | 3/1997 | Harshfield . |
| 5,623,243 | 4/1997 | Watanabe et al. . |
| 5,661,064 | 8/1997 | Figura et al. . |
| 5,786,249 | 7/1998 | Dennison . |
| 5,905,280 * | 5/1999 | Liu et al. ............................. 257/301 |
| 5,972,769 | 10/1999 | Tsu et al. . |

OTHER PUBLICATIONS

A New Toroidal TFT Structure for Future Generation SRAMs, J.D. Hayden, K.J. Cooper, S.S. Roth & H.C. Kirsch, Jan. 1993 IEEE, pp. IEDM 93–825—IEDM 93–828.

A Capacitor–Over–bit–Line (COB) Cell With a Hemispherical–Grain Storage Node for 64Mb DRAMs, M. Sakao, N. Kasai, T. Ishijima, E. Ikawa, H. Watanabe, K. Terada & T. Kikkawa, Jan. 1990 IEEE, pp. IEDM 90–655—IEDM 90–658.

\* cited by examiner

CAPACITOR STRUCTURES, DRAM CELL STRUCTURES, METHODS OF FORMING CAPACITORS, METHODS OF FORMING DRAM CELLS, AND INTEGRATED CIRCUITS INCORPORATING CAPACITOR STRUCTURES AND DRAM CELL STRUCTURES

RELATED PATENT DATA

This patent application is a continuation resulting from U.S. patent application Ser. No. 08/798,241, which was filed Feb. 11, 1997 now U.S. Pat. No. 5,905,280.

TECHNICAL FIELD

This invention pertains to semiconductor capacitor constructions, dynamic random access memory (DRAM) cell constructions, methods of forming semiconductor capacitor constructions, methods of forming DRAM cell constructions, and to integrated circuits incorporating capacitor structures and DRAM cell structures.

BACKGROUND OF THE INVENTION

A DRAM is a commonly used semiconductor device comprising a capacitor and a transistor. A continuous challenge in the semiconductor industry is to decrease the vertical and/or horizontal size of semiconductor devices, such as DRAMs and capacitors. A limitation on the minimal horizontal footprint of capacitor constructions is impacted by the resolution of a photolithographic etch during fabrication of the capacitor constructions. Although this resolution is generally improving, at any given time there is a minimum photolithographic feature dimension of which a fabrication process is capable. It would be desirable to form capacitors at least some portions of which have a cross-sectional minimum dimension of less than the minimum capable photolithographic feature dimension of a given fabrication process.

A problem in the semiconductor industry is mask misalignment. Mask misalignment during device fabrication can lead to inoperative devices. Accordingly, it is desirable to design device-fabrication processes which can compensate for mask misalignment.

SUMMARY OF THE INVENTION

The invention encompasses DRAM cell structures, capacitor structures, methods of forming capacitor structures, methods of forming capacitor structures, and systems incorporating capacitor structures and DRAM structures.

The invention includes methods of forming capacitors wherein an opening is formed within an insulative layer and over a node location. A spacer is formed within the opening to narrow the opening, with the spacer having inner and outer surfaces, with the inner surface forming a periphery of the narrowed opening, with the spacer having an bottom base surface, with the base surface being above the node location. A portion of the insulative layer is removed from proximate the outer surface to expose at least a portion of the outer surface. A storage node layer is formed in electrical connection with the node location, along the spacer inner surface, and along the exposed spacer outer surface. A dielectric layer is formed operatively proximate the storage node layer. A cell plate layer is formed operatively proximate the dielectric layer and the storage node layer.

The invention also includes capacitor constructions. Such include a node location within a substrate; an insulative layer over the substrate; a contact opening extending through the insulative layer to the node location; a conductive spacer within the contact opening and narrowing at least a portion of the contact opening; the conductive spacer having inner and outer surfaces, the inner surface forming a periphery of the narrowed portion of the contact opening; a storage node layer in physical contact with the node location and extending along both of the inner and outer surfaces of the conductive spacer, the storage node layer and conductive spacer together forming a capacitor storage node; a dielectric layer operatively proximate the storage node; and a cell plate layer operatively proximate the storage node and the dielectric layer.

The invention further encompasses DRAM cell structures and microprocessor controlled systems incorporating the above-described capacitors.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method for forming a capacitor structure according to the present invention is described with reference to FIGS. 1–9, with FIGS. 1–8 pertaining to a first embodiment of the invention and FIG. 9 pertaining to a second embodiment of the invention.

Figure 1:
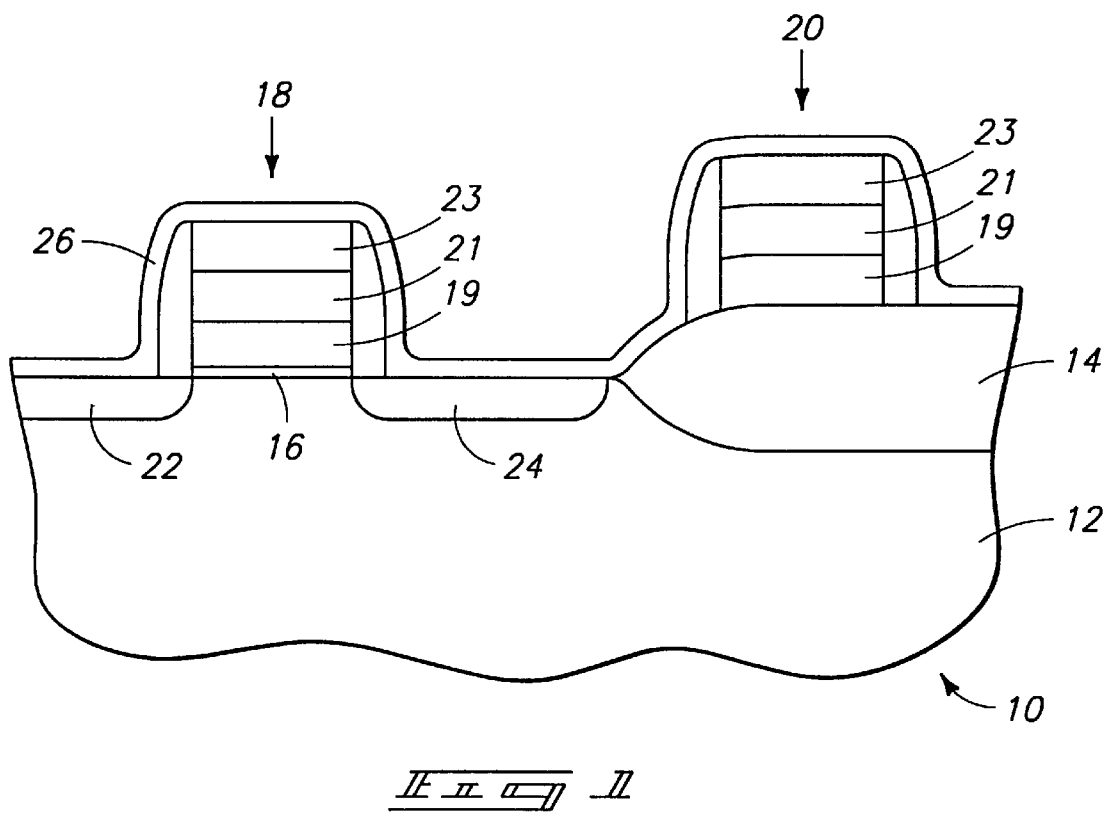
FIG. 1 illustrates a cross-sectional view of a semiconductor wafer fragment at a preliminary processing step according to a first embodiment of the present invention.

Referring to FIG. 1, a semiconductor wafer fragment 10 is illustrated at a preliminary step of a first embodiment of the present invention. Wafer fragment 10 comprises a semiconductor substrate 12, preferably comprising silicon, and most preferably comprising a silicon wafer. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A field oxide region 14, and a gate dielectric layer 16 are formed over substrate 12. Preferably, field oxide region 14 and gate dielectric layer 16 comprise silicon dioxide.

Word lines 18 and 20 are formed over gate dielectric layer 16 and field oxide region 14, respectively. Word lines 18 and 20 preferably comprise a polysilicon layer 19, a metal silicide layer 21, and an insulative material layer 23, as is known to persons of ordinary skill in the art.

Node locations 22 and 24 are proximate word line 18. Node locations 22 and 24 may comprise, for example, diffusion regions, or portions of diffusion regions, within semiconductive substrate 12. For example, node locations 22 and 24 may comprise upper surfaces of source/drain regions within semiconductive substrate 12. Such source/drain regions would comprise conductivity enhancing dopants, such as, for example, phosphorus, arsenic and boron. When node locations 22 and 24 comprise source/drain regions, or portions thereof, word line 18 may comprise a transistor gate electrically coupling such source/drain regions.

An overlying insulative layer 26 is optionally formed over node locations 22 and 24, and over word lines 18 and 20. Insulative layer 26 may inhibit out-diffusion of phosphorus from a subsequently provided borophosphosilicate glass (BPSG) layer (illustrated as 28 in FIG. 2) into node locations 22 and 24 or word lines 18 and 20. Insulative layer 26 may comprise nitride or oxide, and may be formed by conventional methods.

Figure 2:
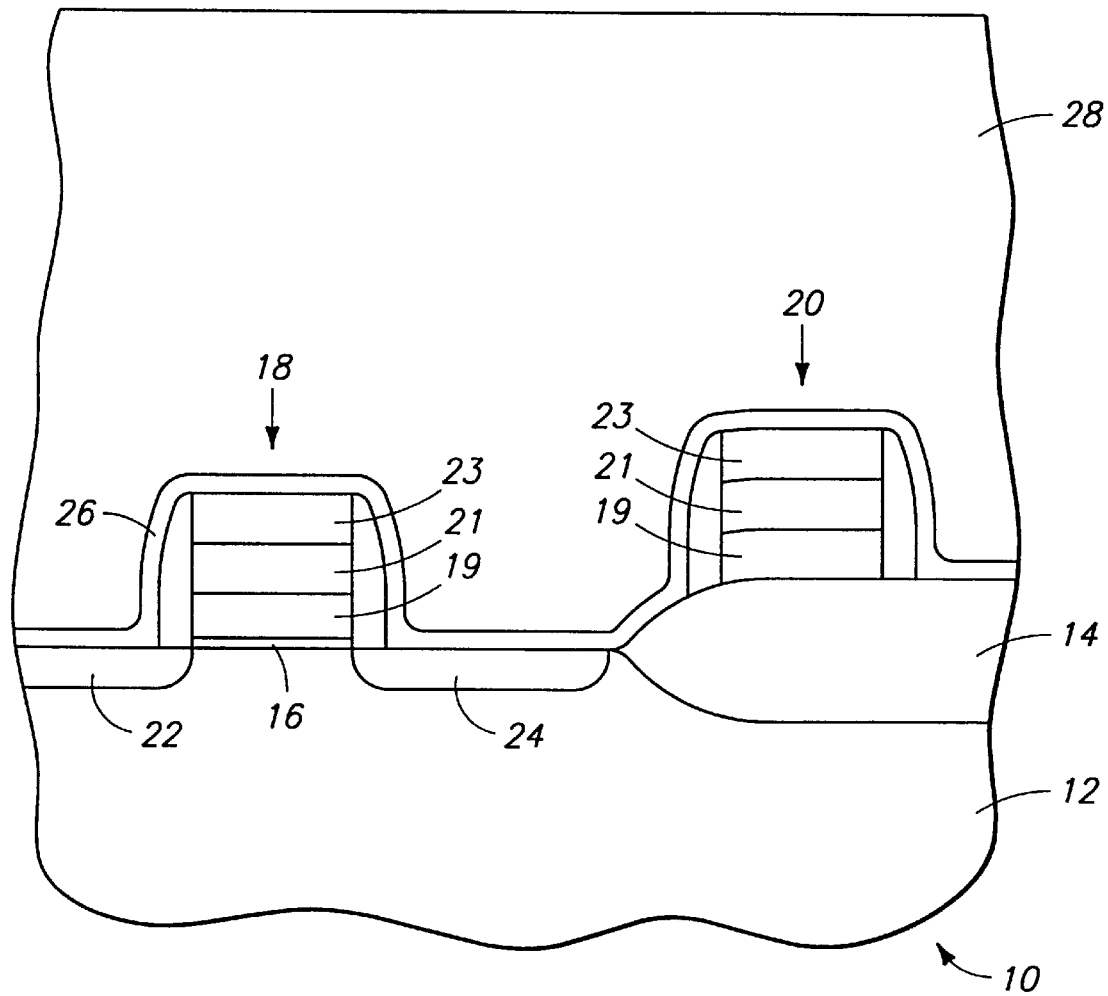
FIG. 2 illustrates the semiconductor wafer fragment of FIG. 1 at a processing step subsequent to that of FIG. 1.

Referring to FIG. 2, an insulative layer 28 is provided over oxide layer 26, node locations 22 and 24, and word lines 18 and 20. Insulative layer 28 preferably comprises BPSG and has a thickness of from about 4000 Angstroms to about 7000 Angstroms over node location 24. BPSG layer 28 may be formed by conventional methods.

Figure 3:
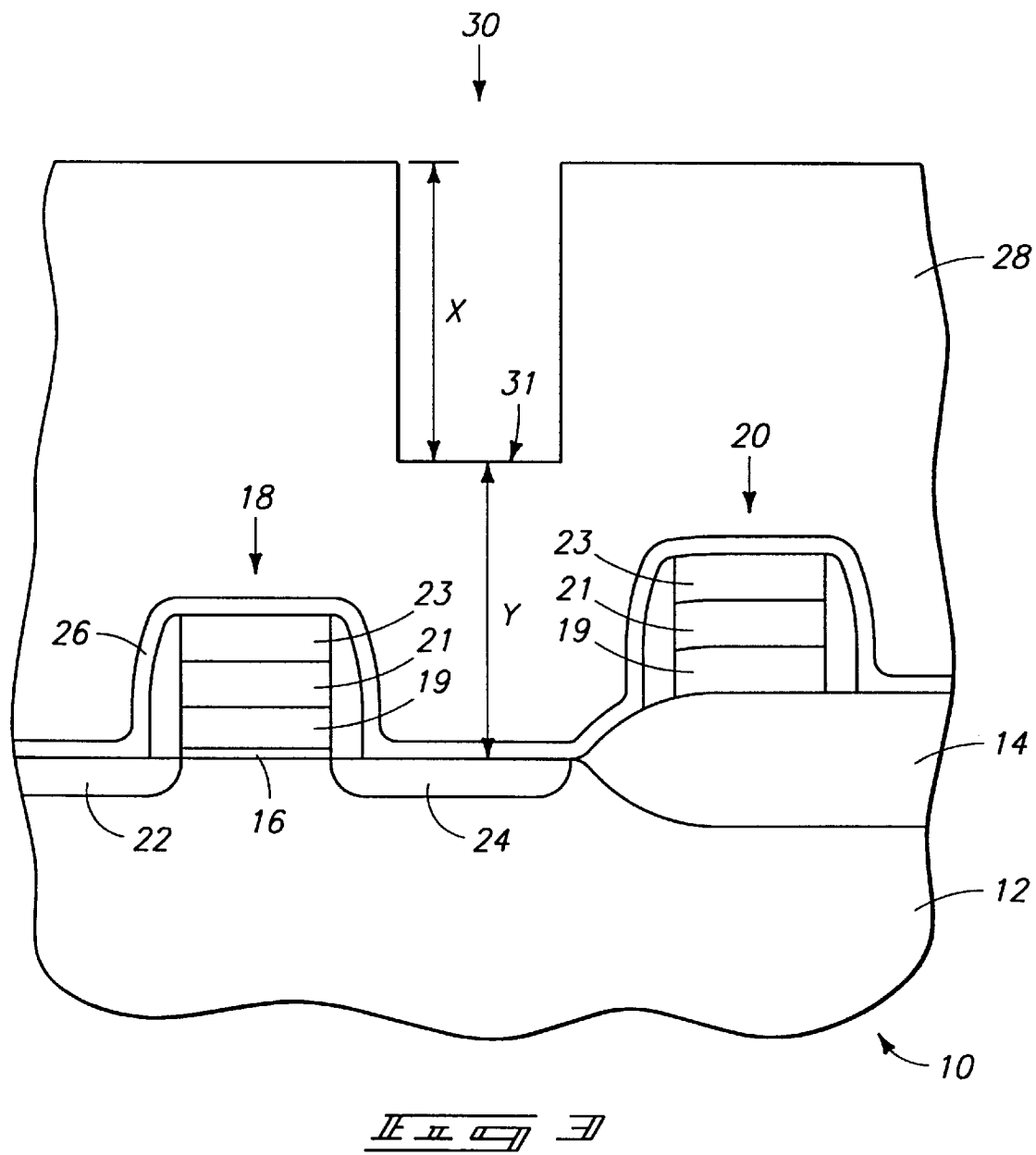
FIG. 3 illustrates the semiconductor wafer fragment of FIG. 1 at a processing step subsequent to that of FIG. 2.

Referring to FIG. 3, an opening 30 is formed within insulative layer 28 and over node location 24. Opening 30 preferably has a minimum cross-sectional width dimension which is equal to a minimum photolithographic feature dimension obtainable during fabrication of opening 30. Opening 30 does not extend to node location 24, but rather comprises a base 31 which is above node location 24 by a distance "Y". Distance "Y" is preferably from about 2000 Angstroms to about 5000 Angstroms. Opening 30 preferably comprises a depth "X" of from about 2000 Angstroms to about 5000 Angstroms. For purposes of the following discussion, opening 30 may alternatively be referred to as a first opening 30. Distance "Y" is preferably greater than or equal to "X".

Figure 4:
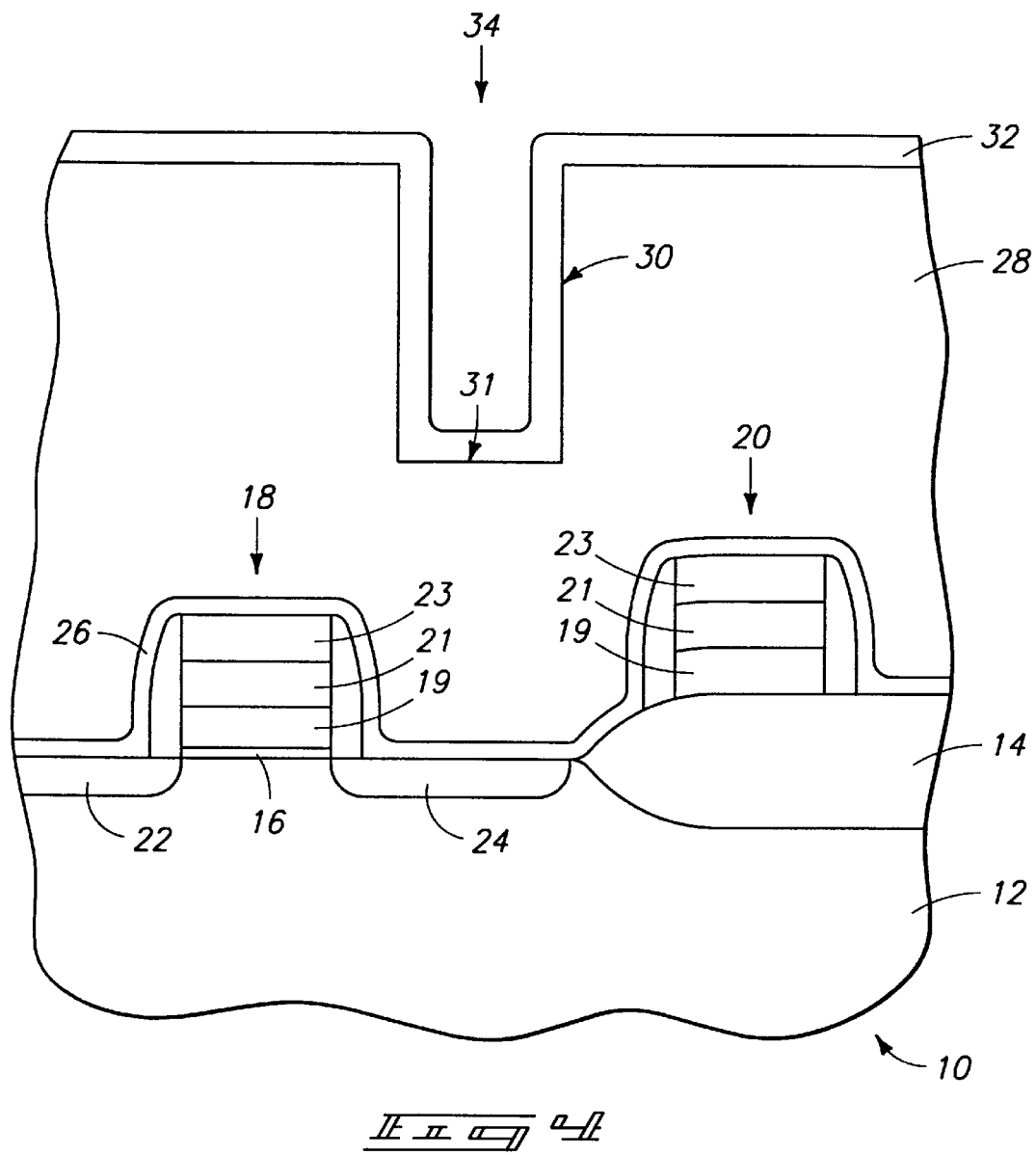
FIG. 4 illustrates the semiconductor wafer fragment of FIG. 1 at a processing step subsequent to that of FIG. 3.

Referring to FIG. 4, a spacer layer 32 is provided over insulative layer 28 and within first opening 30. Spacer layer 32 partially fills opening 30 to form a narrowed opening 34 within opening 30. Spacer layer 32 preferably comprises a conductive material, and most preferably comprises polysilicon doped to a concentration of greater than $1 \times 10^{19}$ atoms/cm$^3$ with a conductivity enhancing dopant. Spacer layer 32 preferably comprises a thickness of from about 1000 Angstroms to about 3000 Angstroms, with about 1500 Angstroms being most preferred. Methods for forming spacer layer 32 are known to persons of ordinary skill in the art. An example method for forming a most preferred conductively doped polysilicon spacer layer 32 would comprise chemical vapor deposition (CVD) of polysilicon and dopant.

Figure 5:
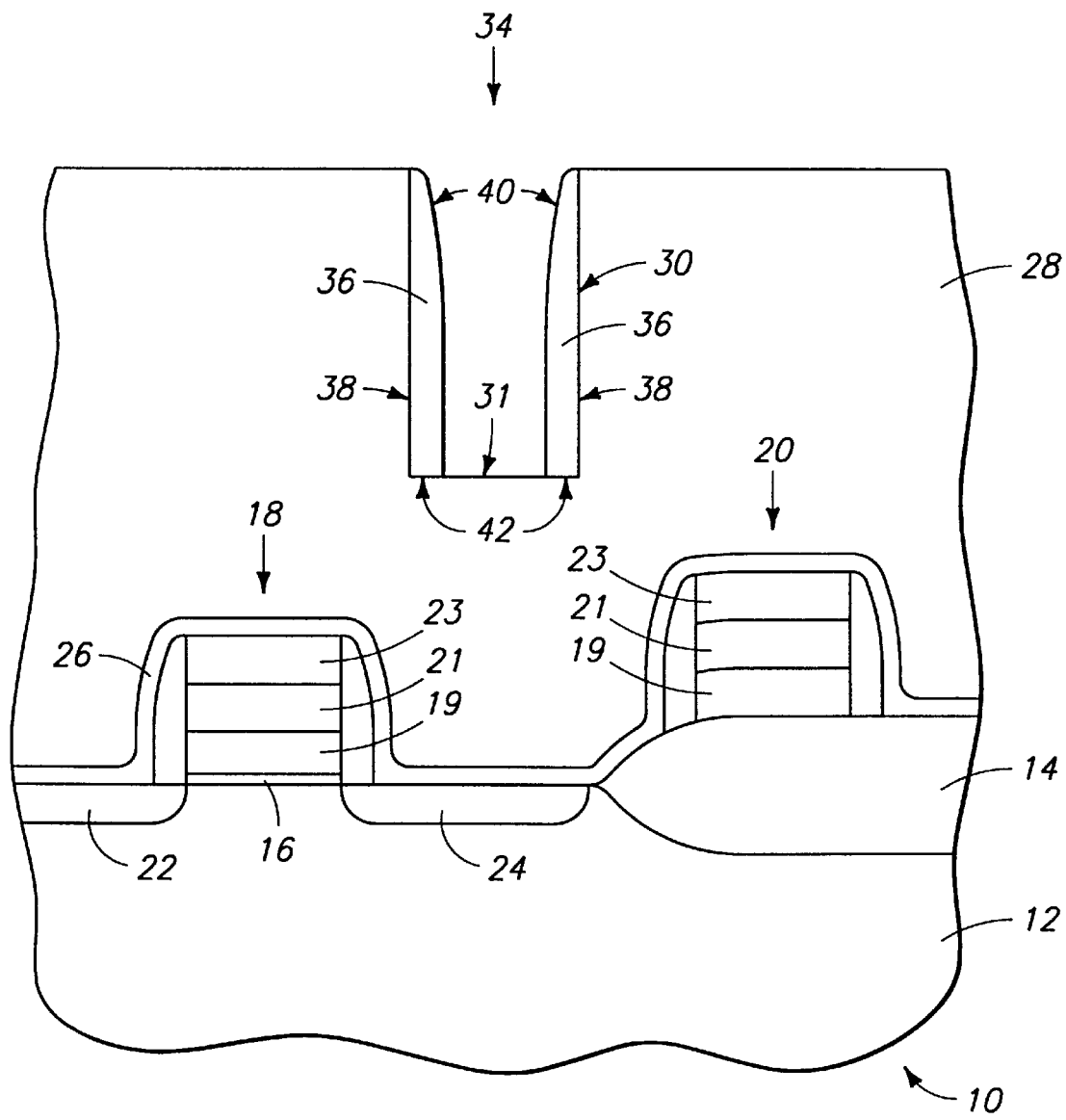
FIG. 5 illustrates the semiconductor wafer fragment of FIG. 1 at a processing step subsequent to that of FIG. 4.

Referring to FIG. 5, layer 32 (shown in FIG. 4) is anisotropically etched to expose base 31 and form a spacer 36 within opening 30. Spacer 36 narrows opening 30 to about the dimensions of narrowed opening 34. Accordingly, if opening 30 is formed to the preferred minimum capable photolithographic feature dimension obtainable during fabrication of opening 30, spacer 36 will form a narrowed opening 34 comprising a minimum width dimension of less than such minimum capable photolithographic feature dimension.

Methods for anisotropically etching layer 32 will be recognized by persons of ordinary skill in the art. An example method for anisotropically etching the preferred conductively doped polysilicon layer 32 would comprise a fluorine based dry etch.

Although spacer 36 appears discontinuous in the shown cross-sectional view of FIG. 5, in preferred embodiments spacer 36 will be continuous around an inner periphery of opening 30.

Spacer 36 comprises opposing surfaces 38 and 40, with surface 40 being an inner surface and surface 38 being an outer surface. Inner surface 40 forms a periphery of narrowed opening 34. Spacer 36 further comprises a bottom surface 42. Bottom surface 42 rests on base 31 and is above node location 24.

Figure 6:
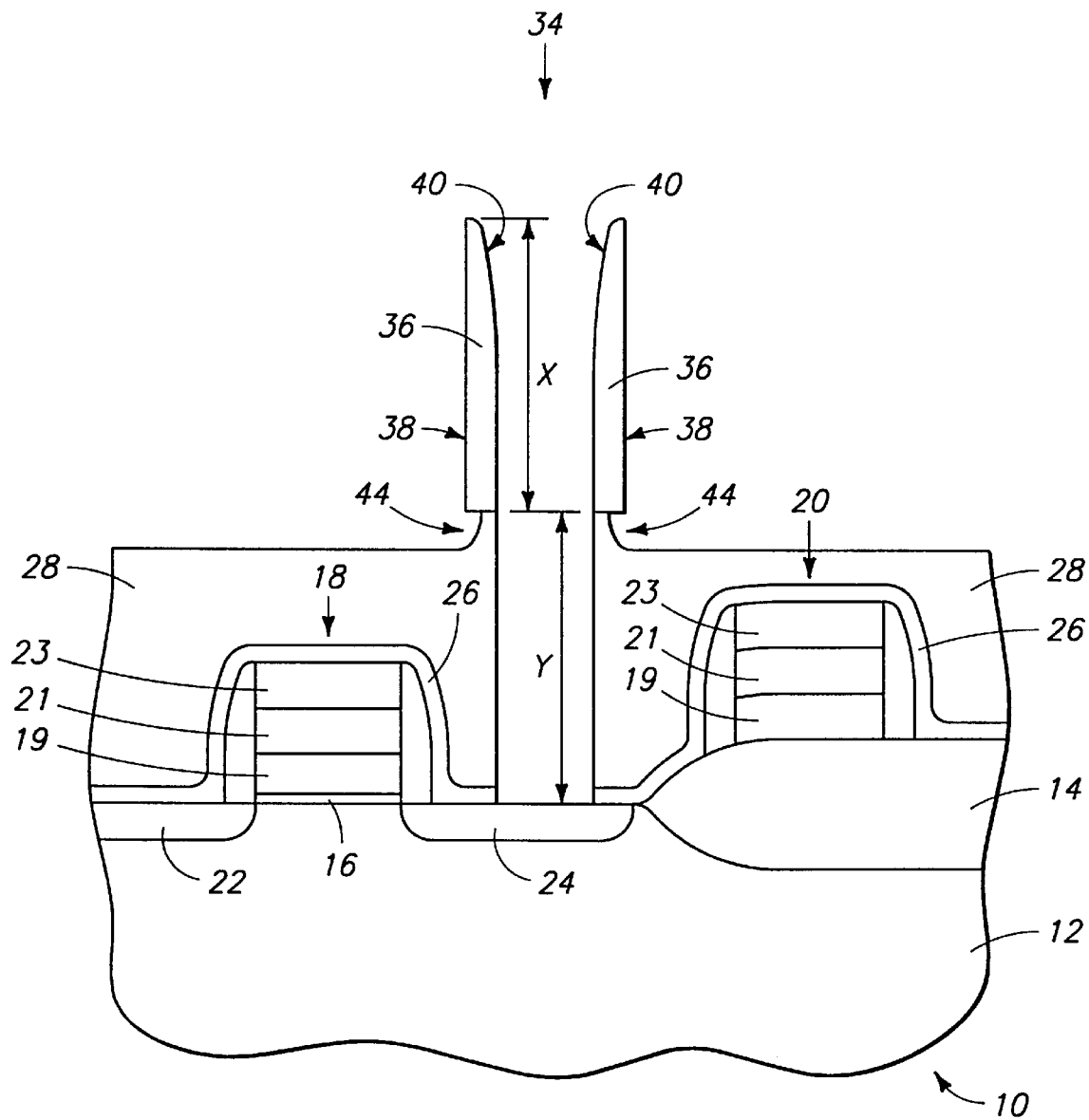
FIG. 6 illustrates the semiconductor wafer fragment of FIG. 1 at a processing step subsequent to that of FIG. 5.

Referring to FIG. 6, a portion of insulative layer 28 is removed to expose the entire outer surface 38 of spacer 36 and to extend narrowed opening 34 to node location 24. Methods for removing insulative layer 28 will be recognized by persons of ordinary skill in the art. Preferably, such methods will remove the material of insulative layer 28 selectively relative to the material of spacer 36. An example method for removing the preferred BPSG layer 28 selectively relative to the preferred conductively doped polysilicon spacer 36 comprises an anisotropic dry etch. Such anisotropic dry etch may also partially undercut spacers 36 to form the shown cavities 44 beneath spacers 36.

It is noted that the relative exposure of surface 38 can be controlled by a number of methods known to persons of ordinary skill in the art. Generally, the amount of insulative layer 28 removed will be the amount necessary to extend opening 34 to node location 24. Accordingly, by controlling the relative ratio of the depth "X" of first opening 30 to the distance "Y" from base 31 of opening 30 to node location 24, the amount of surface 38 exposed can be controlled. For instance, if "X" is relatively large compared to "Y", only a portion of surface 38 of spacer 36 will be exposed in the time necessary to extend opening 34 from base 31 (shown in FIGS. 3–5) to node location 24 (an example embodiment of capacitor construction in which only a portion of surface 38 is exposed is shown in FIG. 9). In contrast, if "X" is relatively small compared to "Y", the entire surface 38 will be exposed in the time necessary to extend opening 34 from base 31 to node location 24.

Figure 7:
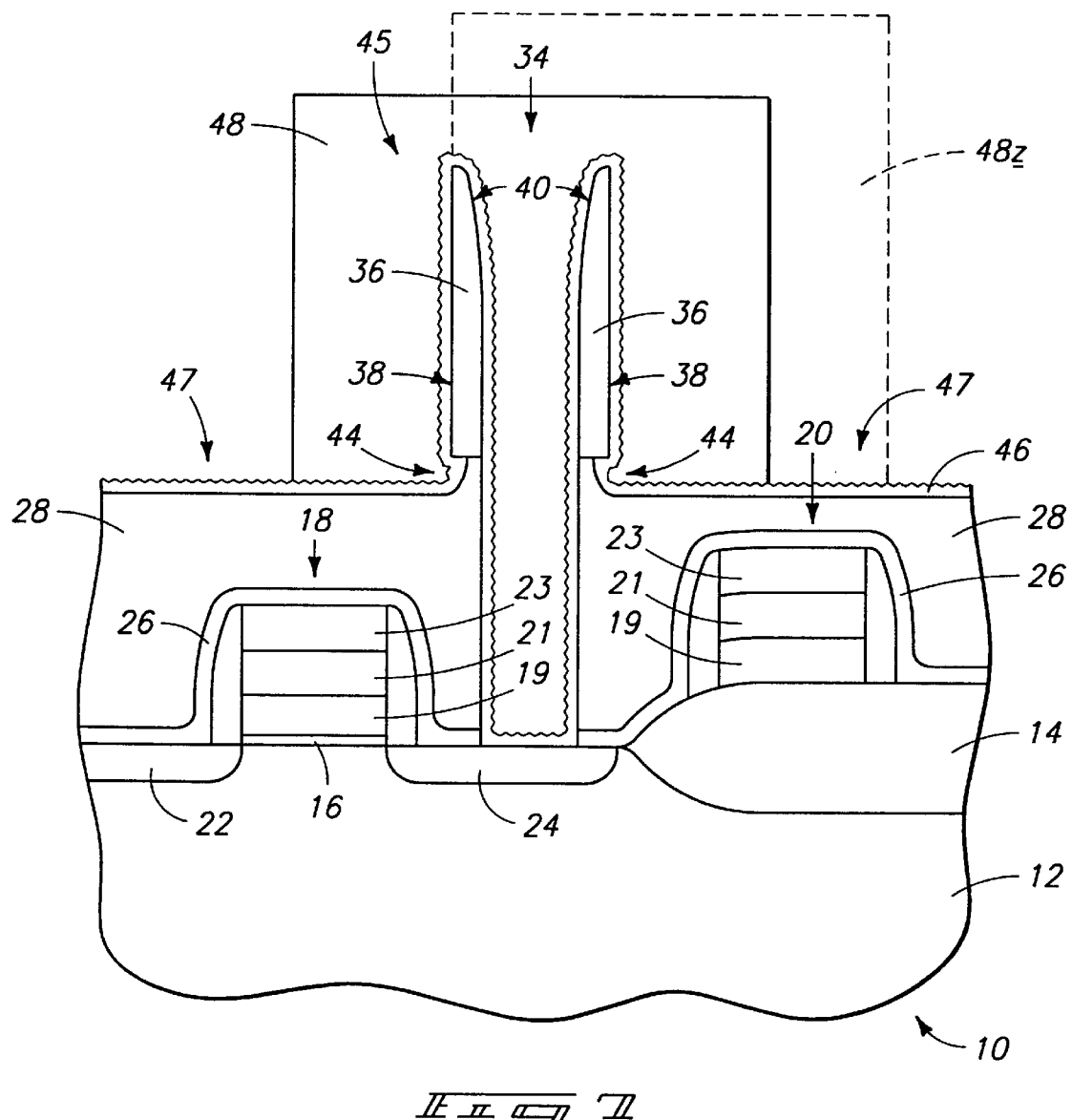
FIG. 7 illustrates the semiconductor wafer fragment of FIG. 1 at a processing step subsequent to that of FIG. 6.
Figure 8:
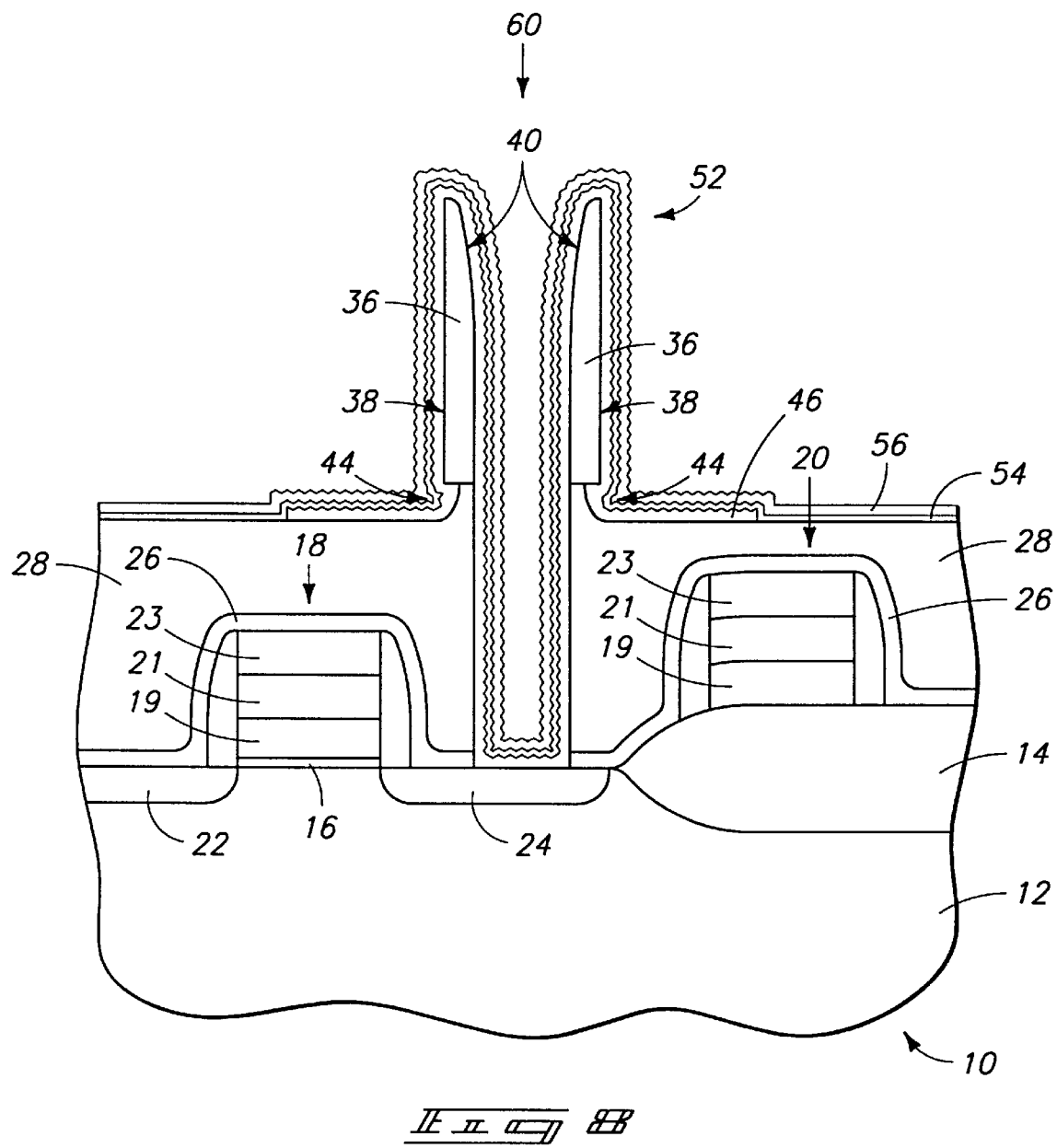
FIG. 8 illustrates the semiconductor wafer fragment of FIG. 1 at a processing step subsequent to that of FIG. 7.

Referring to FIG. 7, a storage node layer 46 is provided over insulative layer 28 and spacers 36, and is provided within opening 34. Storage node layer 46 thus is provided in electrical contact with diffusion region 24 and extends along and in electrical connection with inner surface 40 of spacer 36, and outer surface 38 of spacer 36. In the preferred embodiment in which spacer 36 comprises conductive material, spacer 36 and storage node layer 46 ultimately together comprise a capacitor storage node 52. (Capacitor storage node 52 is shown in FIG. 8.)

Storage node layer 46 preferably comprises conductively doped polysilicon, and most preferably comprised doped hemispherical grain polysilicon. The hemispherical grain polysilicon provides surface irregularities which can increase a surface area of storage node layer 46. Storage node layer 46 may be formed by conventional methods. As shown, storage node layer 46 preferably forms a conformal layer over insulative layer 28. Accordingly, storage node layer 46 preferably envelops within cavities 44.

After formation of storage node layer 46, a patterned masking layer 48, preferably comprising photoresist, is provided over storage node layer 46 to form a protected region 45 and exposed regions 47 of storage node layer 46. Storage node layer 46 is then subsequently etched to remove exposed regions 47 and form the resulting truncated storage node layer 46 shown in FIG. 8. Photoresist masking layer 48 is shown in an idealized and optimal position in FIG. 7. However, occasionally, due to mask misalignment, masking layer 48 will be misaligned relative to opening 34.

A misaligned masking layer 48z is illustrated in dashed line in FIG. 7. In a preferred embodiment of the invention in which spacer 36 comprises a conductive material, the processing of the present invention may compensate for such mask misalignment and produce a functional capacitor device in spite of the mask misalignment. Specifically, the preferred conductive spacers 36 may form a functional storage node in spite of the misalignment of mask 48z.

Referring to FIG. 8, truncated storage node layer 46 and spacers 36 together form a capacitor storage node 52. With masking layer 48 (shown in FIG. 7) having been removed from over capacitor storage node 52, a dielectric layer 54 and a cell plate layer 56 are formed over storage node 52. Dielectric layer 54 and cell plate layer 56 are operatively proximate storage node 52 such that storage node 52 together with dielectric layer 54 and cell plate layer 56 comprises a capacitor structure 60.

Dielectric layer 54 will typically comprise silicon nitride and/or silicon oxide, although other suitable materials are known to persons of skill in the art. Cell plate layer 56 will typically comprise doped polysilicon, but other suitable materials are known to persons of skill in the art.

Figure 9:
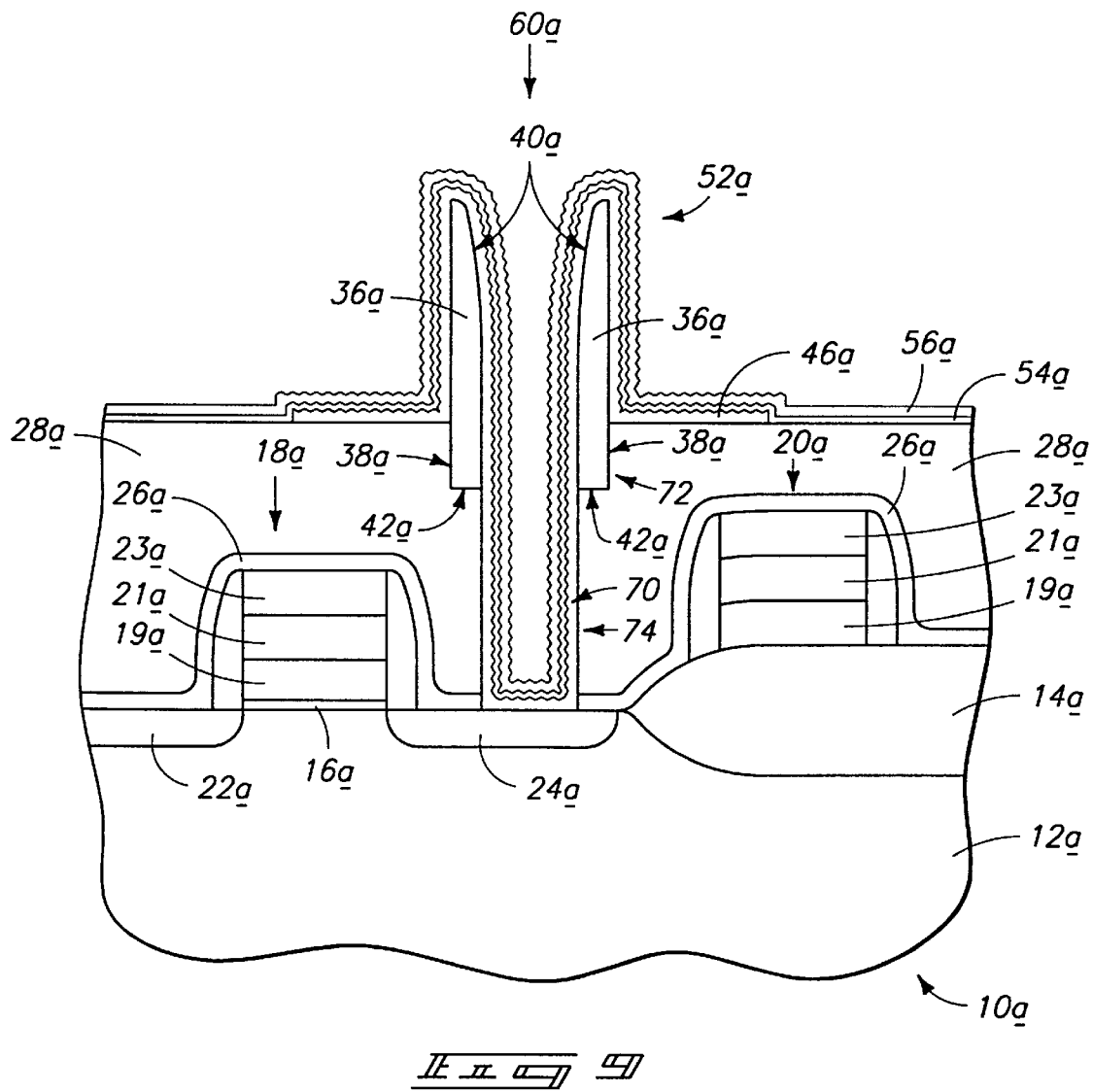
FIG. 9 illustrates the semiconductor wafer fragment of FIG. 1 processed according to a second embodiment of the present invention.

Referring to FIG. 9, a capacitor construction formed by a second embodiment of the present invention is illustrated. In describing the embodiment of FIG. 9, like numerals from the preceding discussion of the embodiment of FIGS. 1–8 are utilized where appropriate, with differences being indicated by the suffix "a" or with different numerals.

Wafer fragment 10a comprises a field oxide region 14a, a gate dielectric region 16a, word lines 18a and 20a, and node locations 22a and 24a, analogous to similar structures described above with reference FIG. 1. Wafer fragment 10a further comprises a capacitor structure 60a which includes a storage node 52a, a dielectric layer 54a and a cell plate layer 56a. Capacitor construction 60a differs from capacitor construction 60 of the previous embodiment (shown in FIG. 8) primarily in that only part of outer surface 38a of spacer 36a is covered by storage node layer 46a, while the entire outer surface 38 of spacer 36 is covered by storage node layer 46 in capacitor construction 60.

Example methods for forming the partially covered outer surface 38a of capacitor 60a were mentioned above with reference to FIG. 6. Specifically, such partially covered outer surface 38a could be formed by appropriate adjustment of the ratio of "X" (shown in FIG. 3) to "Y" (shown in FIG. 3).

Capacitor construction 60a may be described by the language utilized above in describing capacitor construction 60 (shown in FIG. 8), or may be described alternatively. For instance, wafer fragment 10a may be described as follows. Wafer fragment 10a comprises a node 24a within a substrate 12a, and an insulative layer 28a over substrate 12a. A contact opening 70 extends through insulative layer 28a to node location 24a. Contact opening 70 comprises a wider upper portion 72 and a narrower lower portion 74. A conductive spacer 36a is within wider upper portion 72. Conductive spacer 36a comprises inner and outer surfaces 40a and 38a, respectively, and a bottom surface 42a. In the shown preferred embodiment, bottom surface 42a is above node location 24a. Spacer 36a narrows upper portion 72 of contact opening 70, with inner surface 40a forming a periphery of the narrowed contact opening upper portion. A conductive storage node layer 46a is in electrical contact with node location 24a and extends along both inner surface 40a and outer surface 38a of spacer 36a. Storage node layer 46a and spacer 36a together form a capacitor storage node 52a. A dielectric layer 54a and a cell plate layer 56a are operatively proximate storage node 52a.

The various layers and structures of wafer 10a will preferably comprise the same preferable construction as discussed above for wafer fragment 10 with reference to FIGS. 1–8. For instance, spacer 36a will preferably comprise a conductive material, and will most preferably comprise polysilicon doped with a conductivity enhancing dopant. Also preferably, node location 24a will comprise a diffusion region within semiconductor substrate 12a. Semiconductor substrate 12a will most preferably comprise a silicon wafer.

Figure 10:
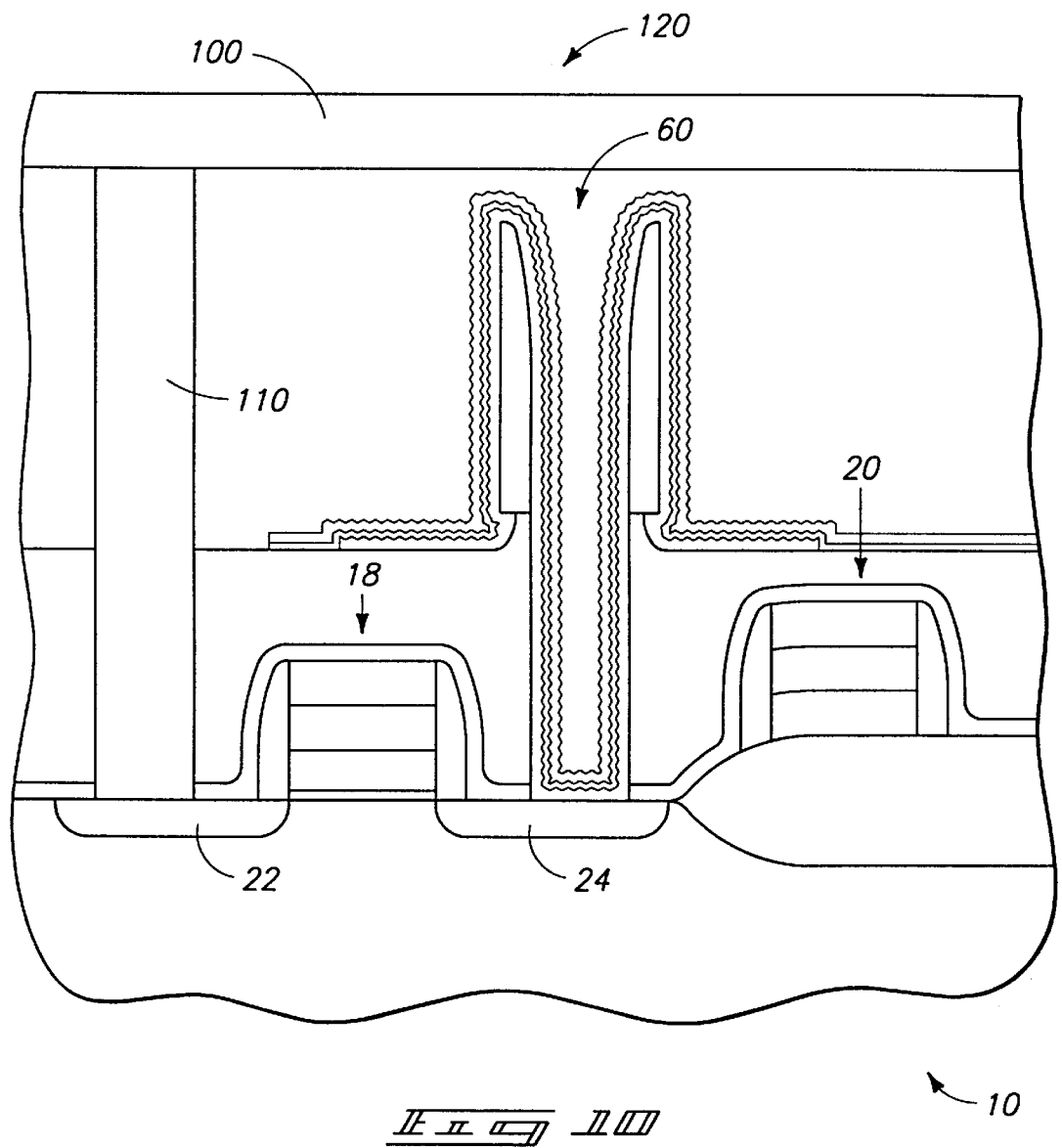
FIG. 10 illustrates a cross-sectional view of a semiconductor wafer fragment comprising a DRAM cell in accordance with an aspect of the invention.

The capacitor structures formed by the methods discussed above with reference to FIGS. 1–9 can be incorporated into DRAM cells. For instance, FIG. 10 illustrates the first embodiment capacitor structure 60 (discussed above with reference to FIG. 8) incorporated into a DRAM cell 120. DRAM cell 120 comprises a transistor gate of wordline 18 and the associated diffusion regions 22 and 24. A bitline contact 110 electrically connects diffusion region 22 to a bitline 100. Bitline contact 110 and bitline 100 can be formed by conventional methods. DRAM cell 120 may be incorporated into a monolithic integrated circuit, such as a microprocessor circuit.

To aid in interpretation of the claims that follow, it is noted that the relative elevational terms used herein, such as "above" and "below", are used merely to indicate relative relationships between structural components. The terms are not meant to indicate absolute relationships. Accordingly, a wafer fragment, such as wafer fragment 10 of FIG. 8, could be inverted and the relative elevational relationship described herein would be unaffected.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted and in accordance with the doctrine of equivalents.

What is claimed is:

1. A capacitor construction comprising:

a node location supported by a substrate;

an insulative layer over the node location and over at least a portion of the substrate proximate the node location;

a first opening extending through the insulative layer to the node location;

a conductive material atop the insulative layer having a second opening therein which joins with the first opening; the conductive material having an inner surface defining a periphery of the second opening and a laterally opposing outer surface;

a storage node layer extending along and in electrical connection with the node location and both of the inner and outer surfaces of the conductive material, the storage node layer and conductive material together forming a capacitor storage node;

a capacitor dielectric layer proximate the storage node; and a capacitor cell plate layer separated from the storage node layer by the capacitor dielectric layer.

2. The capacitor construction claim 1 wherein the storage node layer comprises doped hemispherical grain polysilicon.

3. A capacitor construction comprising:

a node location supported by a substrate;

an insulative layer over the node location and over at least a portion of the substrate proximate the node location;

a first opening extending through the insulative layer to the node location;

a conductive material atop the insulative layer proximate the node location and having a second opening therein which joins with and extends the first opening; the conductive material having inner and outer surfaces, the inner surface being a periphery of the second opening;

a storage node layer in physical contact with the node location and extending along and in electrical connection with both of the inner and outer surfaces of the conductive material, the storage node layer and conductive material together forming a capacitor storage node;

a capacitor dielectric layer operatively proximate the storage node; and a capacitor cell plate layer operatively proximate the capacitor dielectric layer.

4. The capacitor of claim 3 wherein the conductive material comprises polysilicon doped with a conductivity enhancing dopant.

5. A capacitor construction comprising:

a node location supported by substrate;

an insulative layer over the node location and the substrate;

a first opening extending through the insulative layer to the node location;

a conductive material over the insulative layer and having a lowermost surface which is above the node location;

a second opening extending through the conductive material to join with and extend the first opening, the conductive material having inner and outer surfaces, the inner surface being a periphery of the second opening;

a storage node layer in electrical contact with the node location and extending along and in substantial contact with both of the inner and outer surfaces of the conductive material, the storage node layer conductive material together forming a capacitor storage node;

a capacitor dielectric layer extending along the storage node; and a capacitor cell plate layer extending along the capacitor dielectric layer and separated from the storage node by the capacitor dielectric layer.

6. The capacitor of claim 5 wherein the storage node layer extends along an entirety of the inner and outer surfaces of the conductive material.

7. The capacitor of claim 5 wherein the conductive material comprises polysilicon doped with a conductivity enhancing dopant.

8. The capacitor of claim 5 wherein the substrate is a semiconductive wafer and wherein the node location comprises a diffusion region within the semiconductive wafer.

9. A DRAM cell comprising:

a transistor gate over a semiconductor substrate;

first and second diffusion regions within the semiconductor wafer substrate operatively proximate the transistor gate;

an insulative layer over the substrate;

a first opening extending through the insulative layer to the first diffusion region;

a conductive material over the insulative material and having a second opening extending therethrough, the second opening joining with and extending the first opening; the conductive material having inner and outer surfaces, the inner surface forming a periphery of the second opening;

a storage node layer in physical contact with the first diffusion region and extending along and in electrical connection with both of the inner and outer surfaces of the conductive material, the storage node layer and conductive material together forming a capacitor storage node;

a capacitor dielectric layer operatively proximate the storage node;

a capacitor cell plate layer operatively proximate the capacitor dielectric layer; the capacitor dielectric layer, capacitor cell plate layer and storage node together comprising a capacitor; and a bitline in electrical connection with the second diffusion region and electrically coupled to the capacitor through the transistor gate.

10. A monolithic integrated circuit comprising:

fabricated circuitry over a semiconductor substrate, the integrated circuitry comprising transistors, capacitor constructions and resistive elements;

at least one of the capacitor constructions comprising:
a node location supported by a substrate;
an insulative layer over the substrate;
a first contact opening extending through the insulative layer to the node location;
a conductive material over the insulative layer and having a second opening extending therethrough, the second opening joining with the first opening; the conductive spacer having an inner surface defining a periphery of the second opening, and having an outer surface laterally opposing the inner surface;
a storage node layer in physical contact with the node location and extending along and in electrical connection with both of the inner and outer surfaces of the conductive material, the storage node layer and conductive material together forming a capacitor storage node;
a capacitor dielectric layer proximate the storage node; and
a capacitor cell plate layer separated from the storage node by the capacitor dielectric layer.

11. The monolithic integrated circuit of claim 10 wherein the integrated circuit is part of a microprocessor circuit.

12. The monolithic integrated circuit of claim 10 wherein the integrated circuit is part of a microprocessor circuit and wherein the at least one capacitor is incorporated into a DRAM cell.

* * * * *

UNITED STATES PATENT AND TRADEMARK OFFICE
CERTIFICATE OF CORRECTION

PATENT NO : 6,175,129
DATED : January 16, 2001
INVENTOR(S) : Yauh-Ching Liu et al.

It is certified that error appears in the above-identified patent and that said Letters Patent are hereby corrected as shown below:

In the Abstract, line 16 replace "qexposed" with --exposed--.

Col. 5, line 51 after "reference" insert --to--.

Col. 7, line 43 after "by" insert --a--.

Signed and Sealed this

Fifteenth Day of May, 2001

*Attest:*

NICHOLAS P. GODICI

*Attesting Officer*    *Acting Director of the United States Patent and Trademark Office*